United States Patent
Liu et al.

(10) Patent No.: US 10,714,520 B1
(45) Date of Patent: Jul. 14, 2020

(54) MANUFACTURING AN ON-CHIP MICROLENS ARRAY

(71) Applicant: Facebook Technologies, LLC, Menlo Park, CA (US)

(72) Inventors: Xinqiao Liu, Medina, WA (US); Yijing Fu, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/030,206

(22) Filed: Jul. 9, 2018

Related U.S. Application Data (60) Provisional application No. 62/541,406, filed on Aug. 4, 2017.

(51) Int. Cl.
| | |
|---|---|
| *H01L 27/146* | (2006.01) |
| *H04N 5/225* | (2006.01) |
| *H01L 33/44* | (2010.01) |
| *G06F 3/01* | (2006.01) |

(52) U.S. Cl.
CPC .... *H01L 27/14627* (2013.01); *H01L 27/1462* (2013.01); *H01L 27/1463* (2013.01); *H01L 27/14643* (2013.01); *H01L 27/14685* (2013.01); *H01L 33/44* (2013.01); *H04N 5/22541* (2018.08); *G06F 3/013* (2013.01)

(58) Field of Classification Search
CPC .......... H01L 27/14627; H01L 27/1463; H01L 27/14685; H01L 27/1462; H01L 27/14643; H01L 33/44
See application file for complete search history.

(56) References Cited

U.S. PATENT DOCUMENTS

| | | | | |
|---|---|---|---|---|
| 2005/0186754 | A1* | 8/2005 | Kim | H01L 27/1462 438/401 |
| 2006/0124948 | A1* | 6/2006 | Lee | H01L 27/14621 257/98 |
| 2008/0130005 | A1* | 6/2008 | Waslowski | G01C 3/085 356/446 |
| 2008/0206659 | A1* | 8/2008 | Yoshibayashi | G02B 5/201 430/7 |
| 2008/0278820 | A1* | 11/2008 | Li | G02B 3/0018 359/621 |
| 2011/0018080 | A1* | 1/2011 | Ootake | H01L 27/14621 257/432 |
| 2011/0053309 | A1* | 3/2011 | Hsieh | H01L 27/14627 438/69 |

(Continued)

*Primary Examiner* — Joseph C. Nicely
(74) *Attorney, Agent, or Firm* — Fenwick & West LLP (57) ABSTRACT

A method for monolithically fabricating a light field sensor with an array of microlens. Each microlens is formed directly on a surface including a plurality of pixels of the light field sensor formed on a wafer. The manufacturing system performs a preparation of the surface including the plurality of pixels formed on the wafer. The manufacturing system deposits a layer of photoresist on the surface of the wafer. The manufacturing system performs a patterning on the deposited layer to form one or more blocks of cured photoresists. The manufacturing system performs a thermal curing of the one or more blocks of uncured photoresists to form an array of microlens of the light field sensor. Each microlens covers at least one of the plurality of pixels of the light field sensor formed on the wafer.

20 Claims, 7 Drawing Sheets

(56) References Cited

U.S. PATENT DOCUMENTS

| | | | |
|---|---|---|---|
| 2012/0202145 A1* | 8/2012 | Arayama | G03F 7/027 430/7 |
| 2013/0083225 A1* | 4/2013 | Minowa | H01L 27/14627 348/294 |
| 2014/0091419 A1* | 4/2014 | Hasegawa | G02B 13/004 257/432 |
| 2014/0177081 A1* | 6/2014 | Sugishima | H01L 27/14621 359/891 |
| 2015/0168611 A1* | 6/2015 | Osawa | H01L 27/14618 348/360 |
| 2015/0222833 A1* | 8/2015 | Murata | H01L 27/14627 250/208.1 |
| 2016/0013241 A1* | 1/2016 | Yamaguchi | H01L 27/14645 257/225 |
| 2016/0122547 A1* | 5/2016 | Samejima | G03F 7/0007 252/586 |
| 2016/0142660 A1* | 5/2016 | Shen | H04N 5/361 348/162 |
| 2017/0186795 A1* | 6/2017 | Tsai | H01L 27/14627 |
| 2017/0315406 A1* | 11/2017 | Sasaki | G02F 1/133606 |
| 2018/0269247 A1* | 9/2018 | Kumai | H01L 27/14621 |
| 2018/0281502 A1* | 10/2018 | Zhu | B42D 25/21 |
| 2018/0284534 A1* | 10/2018 | Song | G02F 1/133617 |
| 2019/0028640 A1* | 1/2019 | Kanda | H04N 5/23229 |
| 2019/0096943 A1* | 3/2019 | Lee | H01L 27/14625 |
| 2019/0196325 A1* | 6/2019 | Miyata | G03F 7/004 |
| 2019/0252450 A1* | 8/2019 | Noudo | H01L 27/146 |
| 2019/0297288 A1* | 9/2019 | Tang | H04N 5/225 |
| 2019/0312075 A1* | 10/2019 | Yamamoto | H01L 27/1464 |
| 2019/0319058 A1* | 10/2019 | Imoto | H01L 27/14685 |

* cited by examiner

MANUFACTURING AN ON-CHIP MICROLENS ARRAY

CROSS REFERENCE TO RELATED APPLICATIONS

This application claims the benefit of U.S. Provisional Application No. 62/541,406, filed Aug. 4, 2017, which is incorporated by reference in its entirety.

BACKGROUND

The present disclosure generally relates to methods of manufacture for sensor arrays, and specifically to a method of manufacture of an array of microlens over an array of pixels in an image sensor of the light field camera.

Some types of the light field camera use an array of microlenses placed in front of an image sensor to sense the intensity, color and directional information from the scene. The image sensor and the array of microlenses are placed at a distance of separation in order to focus the light field on the array of microlenses at its focal plane. The distance of separation is determined by several factors such as a width of each pixel in the image sensor, a focal depth of the micro-lens, and a width of the micro-lens. In conventional light field cameras, any variation in the distance of separation results in a misfocus causing a blurring in the images. Furthermore, the coupling of the array of microlenses to the image sensor requires proper alignment which may be difficult to maintain over extended periods of time due to environmental factors.

Accordingly, the design of conventional light field cameras has a limitation of precise placement of the array of microlenses on the image sensor due to the lack of a monolithic process.

SUMMARY

Embodiments relate to a manufacturing system for fabricating an image sensor with an array of microlens. Each microlens is formed directly on a surface including a plurality of pixels of the image sensor formed on a wafer. The manufacturing system performs a preparation of the surface including the plurality of pixels formed on the wafer. The manufacturing system deposits a layer of photoresist on the surface of the wafer. The manufacturing system performs a patterning on the deposited layer to form one or more blocks of cured photoresists. The manufacturing system performs a thermal curing of the one or more blocks of uncured photoresists to form an array of microlens of the image sensor. Each microlens covers at least one of the plurality of pixels of the image sensor formed on the wafer.

In some embodiments, the manufacturing system performs the thermal curing of the one or more blocks of uncured photoresists includes performing a curing of the one or more blocks into an intermediate shape of the array of microlens and performing a spreading of the cured blocks that changes the intermediate shape into a final shape. In some embodiments, each microlens has a diameter in the range of 6 microns to 30 microns and a height in the range of 1 micron to 10 microns. In some embodiments, the image sensor includes an array of macropixels. Each macropixel includes an array of the plurality of pixels that are each covered by a single microlens.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

A head mounted display (HMD) includes a light field camera to capture information about intensity and angle information for one or more objects in a field of view of the light field camera. In one embodiment, the light field camera can be used for determining depth of a scene. In another embodiment, the light field camera can be used for eye tracking. The HMD presents content via an electronic display to the user at a specific focal distance. The light field camera includes a main lens, an array of microlenses and an image sensor. The light field emanating from the scene passes through the main lens configured to focus the received light field on to the array of microlenses. The array of microlenses focuses the received light field at its focal plane. The image sensor senses the focused light field from the array of microlenses. While the design of conventional light field cameras has a limitation of precise placement of the array of microlenses on the image sensor, the light field camera disclosed herein is manufactured by forming the array of microlenses on a substrate in a monolithic fashion. For example, conventional techniques are often based on mechanically bonding the array of microlenses formed on a transfer substrate onto a relatively larger parent substrate that mounts electronic and/or photonic circuits. In contrast, forming the array of microlenses directly on the substrate monolithically obviates the additional step of mechanically bonding these microlenses on a specific location of the substrate with a target precision during alignment. Accordingly, there is a reduction in blurring in the images captured by the light field camera with a monolithically formed array of microlenses on the substrate.

In some artificial reality devices (e.g., those on mobile platforms), form factor for a camera is relatively small, as smaller devices are easier to integrate into, e.g., HMDs and near-eye displays (NEDs). Forming a microlens directly on sensor helps reduce the size of the camera as well as reduces cost while increasing robustness of the camera. Conventional light field cameras focus on consumer photography applications—where form factor is not as important as it would be in the context of a head-mounted artificial reality device. For example, a conventional light field camera has a large sensor (e.g., a full frame sensor) that would have tens of mega pixels and is quite large, has a large power budget, and is expensive. In conventional light field camera configurations, there are a lot of pixels under each microlens element (e.g., 20×20), which results in longer distance from the image sensor to the microlens (which increases form factor). In contrast, in the context of a light field camera in a HMD or a NED, the image sensor typically has a smaller number of pixels under each microlens (e.g., at most 4×4) and a lower resolution relative to conventional light field cameras. The small distance between microlens and the image sensor allows for direct integration of the microlens on to the image sensor, i.e., monolithic solution. Moreover, the resulting light field camera has a very small form factor, is relatively cheap, and can have a lower power budget.

The image sensor is manufactured by placing the array of microlenses on a substrate (e.g. a silicon chip). Different embodiments in the disclosure illustrate the methods used for the fabrication of the array of microlenses over an array of pixels. One application may be, e.g., to achieve an array of macropixels that collectively from the image sensor of the light field camera. In some embodiments, at least some of the microlenses of the array of microlenses each cover a respective pixel of the array of pixels. In other embodiments, at least some of the microlenses of the array of microlenses each cover a respective plurality of pixels of the array of pixels. A microlens of the array of microlenses may be a concave lens, a convex lens, a spherical lens, a cylindrical lens, a freeform lens, an aspherical lens, a Fresnel lens, or some combination thereof.

Figure 1A:
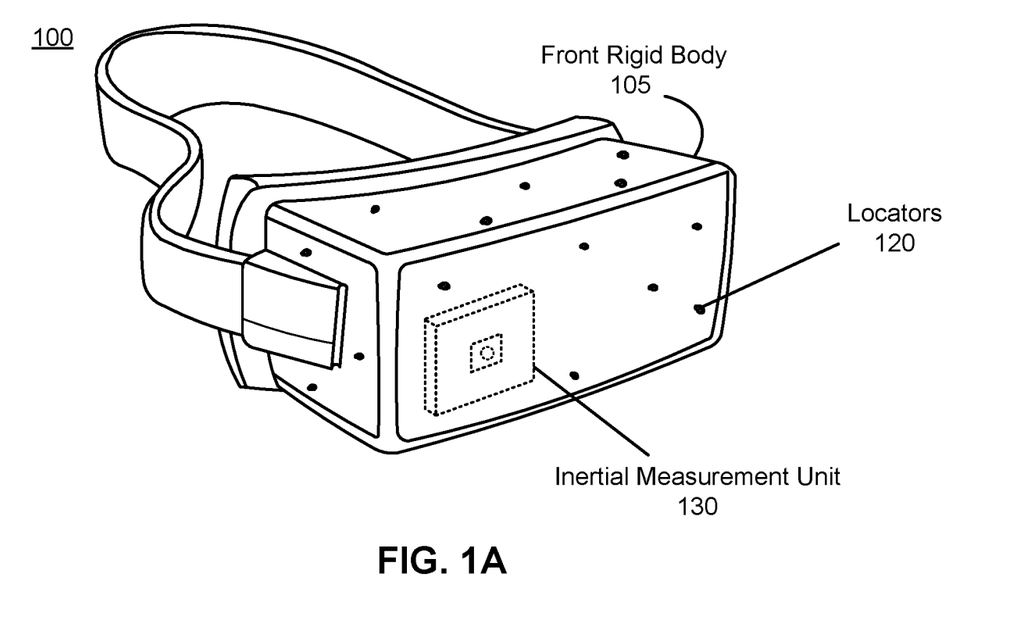
FIG. 1A is a diagram of a HMD, in accordance with an embodiment.

FIG. 1A is a diagram of a HMD 100, in accordance with an embodiment. The HMD 100 includes electronic display elements (not shown in FIG. 1A), a plurality of locators 120, and an IMU 130. The locators 120 are objects located in specific positions on the HMD 100 relative to one another. The locators 120 may be a light emitting diode (LED), a corner cube reflector, a reflective marker, a type of light source that contrasts with an environment in which the HMD 100 operates, or some combination thereof. The IMU 130 is an electronic device that generates fast calibration data based on measurement signals received from a plurality of head tracking sensors (e.g. accelerometers, gyroscopes, magnetometers), which generate a plurality of measurement signals in response to motion of the HMD 100. In embodiments, where the HMD 100 operates as in an AR or MR environment, portions of the HMD 100 are at least partially transparent to light in the visible band, such that light external to the HMD 100 may be combined with displayed light and presented to the user.

Figure 1B:
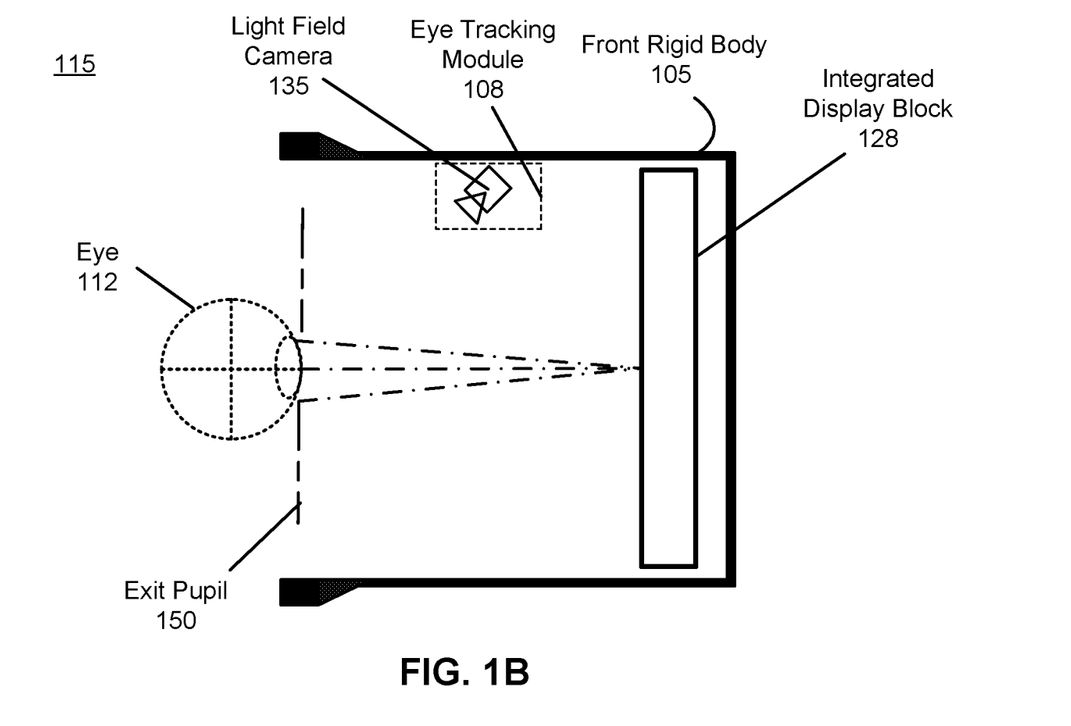
FIG. 1B is a cross section of a front rigid body of the HMD in FIG. 1A, in accordance with an embodiment.

FIG. 1B is a cross section of the HMD 100 shown in FIG. 1A. As shown in FIG. 1B, the HMD 100 includes display elements that provide focus adjusted image light to an exit pupil 150. The cross-section of the HMD 100 includes an eye tracking module 108, and an integrated display block 128. The eye tracking module 108 includes a light field camera 135. The eye tracking module 108 tracks a position of the user's eye 112 using depth information provided by the light field camera 135. The light field camera 135 includes an image sensor formed using an array of optical elements, described below in conjunction with FIG. 2A. In some embodiments (not shown), the eye tracking module 108 may include, e.g., an infrared illumination source that illuminates the eye 112. The light field camera 135 captures light reflected from the eye 112 in one or more image frames. The light field camera 135 is placed outside of a main line of sight of the user. For purposes of illustration, FIG. 1B shows a cross section of the HMD 100 associated with a single eye 112, but another integrated display block, separate from the integrated display block 128, provide integrated image light to another eye of the user.

The eye tracking module 108 tracks an eye position and eye movement of a user of the HMD 100. A camera or other optical sensor inside the HMD 100 captures information of a user's eyes, and the eye tracking module 108 uses the captured information to determine interpupillary distance, interocular distance, a three-dimensional (3D) position of each eye relative to the HMD 100 (e.g., for distortion adjustment purposes), including a magnitude of torsion and rotation (i.e., roll, pitch, and yaw) and gaze directions for each eye. In one example, infrared light is emitted within the HMD 100 and reflected from each eye. The reflected light is received or detected by the camera and analyzed to extract eye rotation from changes in the infrared light reflected by each eye. Many methods for tracking the eyes of a user can be used by the eye-tracking module 108. Accordingly, the eye tracking module 108 may track up to six degrees of freedom of each eye (i.e., 3D position, roll, pitch, and yaw) and at least a subset of the tracked quantities may be combined from two eyes of a user to estimate a gaze point (i.e., a 3D location or position in the virtual scene where the user is looking). For example, the eye tracking module 108 integrates information from past measurements, measurements identifying a position of a user's head, and 3D information describing a scene. Thus, information for the position and orientation of the user's eyes is used to determine the gaze point in a virtual scene presented by the HMD 100 where the user is looking.

The integrated display block 128 presents visual information (i.e., image light) from an electronic signal. The integrated display block 128 includes one or more electronic display elements. An electronic display element may be, e.g., a liquid crystal display (LCD), an organic light emitting diode (OLED) display, a micro LED, a superluminous LED, an active-matrix organic light-emitting diode display (AMOLED), some type of flexible display, or some combination thereof. In some embodiments, the integrated display block 128 presents a 3D information describing a scene to the user's eye 112. The light field camera 135 captures light reflected from the user's eye 112 corresponding to the presented 3D information.

Figure 2A:
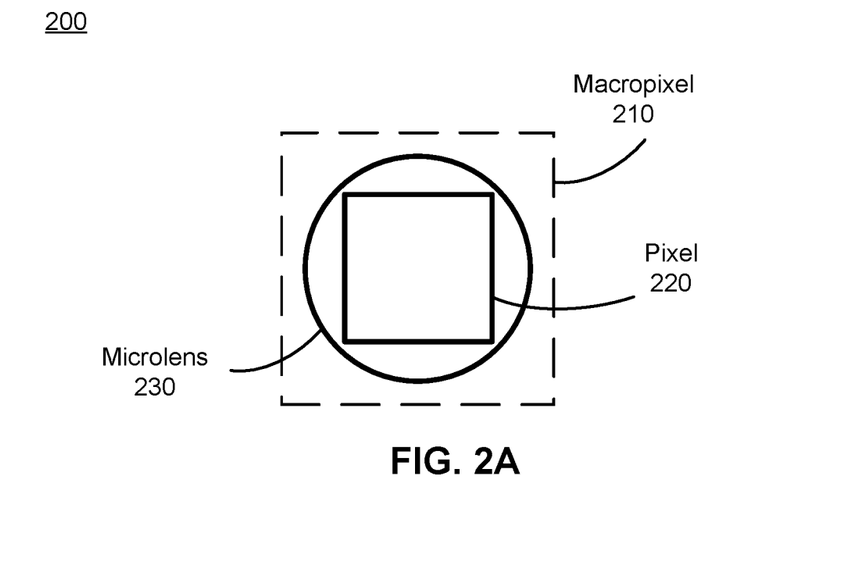
FIG. 2A is a top view of a macropixel, in accordance with an embodiment.

Turning now to a discussion of an image sensor in a light field camera, FIG. 2A is a top view 200 of a macropixel 210, in accordance with an embodiment. The image sensor of the light field camera is formed using an array of macropixels 210. Each macropixel includes a pixel 220 and a single corresponding microlens 230. Accordingly, an image sensor that is an n×N array of macropixels includes an n×N array of pixels 220 that are each covered by a corresponding microlens 230, where n and N are whole numbers.

The pixel 220 is an optical component in an image sensor that senses a light field with information about intensity and angle information for one or more objects in the field of view of the light field camera 135. In some embodiments, the pixel 220 is an optical chip including a die and an anti-reflective (AR) layer. For example, the pixel 220 is a silicon chip with several anti-reflective layers made of silicon nitride. The anti-reflective layer is a stack of layers of materials that suppresses the reflection of the light field emanating from the scene. The pixel 220 can be of several different geometrical shapes, including but not restricted to, a square, a circle, a rectangle, and any other polygon. In some embodiments, the pixel 220 includes at least one of a photodiode, a color filter, or any combination thereof.

The microlens 230 is an optical component that focuses a light field from a light field camera on to an image sensor. The microlens 230 is an optical lens made of, e.g., plastics, glass, polyimides, polyimides and titania nanocomposite, polyphenylquinoxalines, and organometallic polymers, or some combination thereof.

In some embodiments, the microlens 230 has a size ranging from a few tens of microns to few hundreds of microns. For example, the microlens 230 can have a diameter ranging from 6 microns to 30 microns and a height ranging from 6 microns to 60 microns. The microlens 230 is an optical lens that has a surface profile including, but not restricted to, spherical (e.g., hemisphere), cylindrical, freeform, concave, convex, aspherical, Fresnel, or some combination thereof.

Figure 2B:
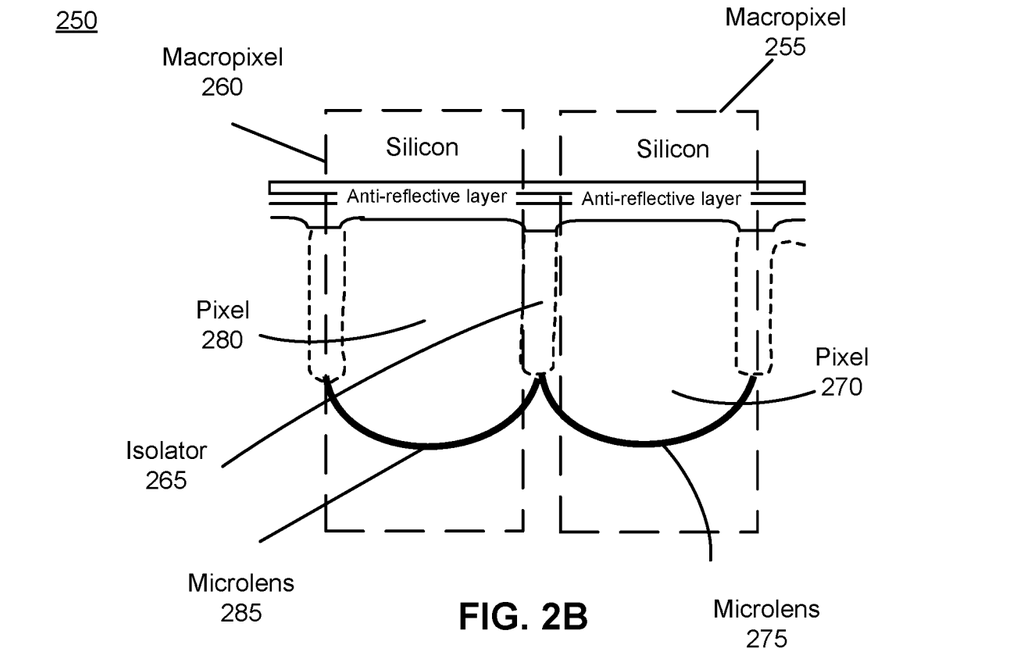
FIG. 2B is a cross section of a portion of an image sensor for a light field camera, in accordance with an embodiment.

FIG. 2B is a cross section 250 of a portion of an image sensor for a light field camera, in accordance with an embodiment. The cross section 250 includes a macropixel 255 and a macropixel 260 that are separated by an isolator 265. The macropixel 255 includes a pixel 270, and an associated microlens 275, and the macropixel 260 includes a pixel 280 and an associated microlens 285. In some embodiments, the macropixel 255 includes the pixel 270, the associated microlens 275 and a plurality of anti-reflective (AR) layers. Each of the plurality of AR layers suppresses the reflection of the light field received by the pixel 270.

The isolator 265 is a passive optical element that separates each of the pixels of the image sensor and suppresses the transmission of the light field in a specific direction (i.e., mitigates cross talk between adjacent pixels). In some embodiments, the isolator 265 is made of metallic material, a reflective material, an optically opaque material, or some combination thereof. The isolator 265 has a height of at most 10 microns. The isolator 265 separates the pixel 270 from the pixel 280.

Figure 2C:
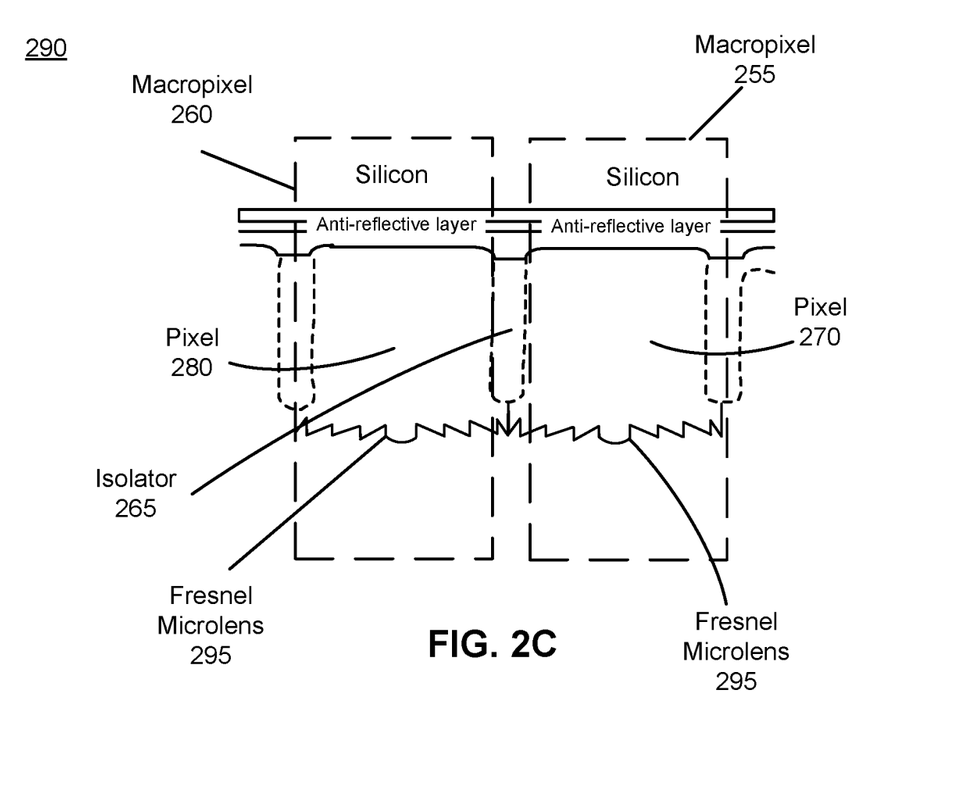
FIG. 2C is a cross section of a portion of an image sensor for a light field camera with a Fresnel microlens, in accordance with an embodiment.

FIG. 2C is a cross section 290 of a portion of an image sensor for a light field camera with a Fresnel microlens 295, in accordance with an embodiment. The Fresnel microlens 295 is an embodiment of the microlens 230 and/or the microlens 285.

One advantage of a Fresnel lens is it is has a relatively flat lens structure (e.g., compared to a traditional convex lens structure). Accordingly, thickness and weight of the Fresnel microlens 295 can be significantly reduced.

The Fresnel microlens 295 may be fabricated onto the sensor surface using, e.g., nanoimprint technology. First, a lens master mold with the right design is fabricated using FIB or other etching technologies; a UV-curable polymer layer is spin coated onto the sensor surface. After the lens master mold and the sensor substrate are pressed together, the polymer layer is cured in UV light and becomes solid. By pushing the mold away (i.e., mold separation), the pattern on the master is replicated on the sensor surface.

Figure 3A:
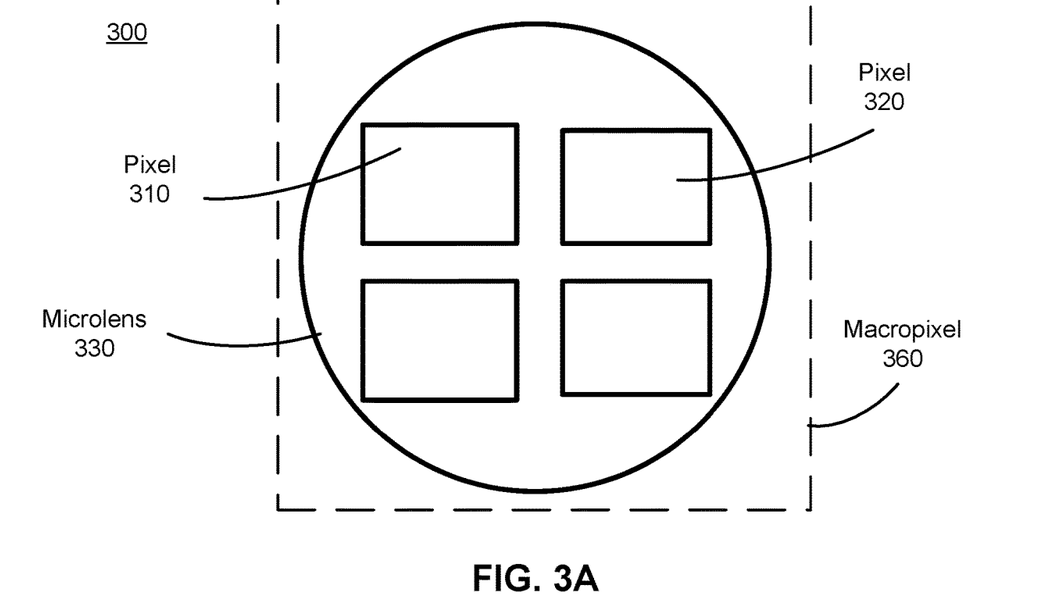
FIG. 3A is a top view of a macropixel, in accordance with an embodiment.

FIG. 3A is a top view 300 of a macropixel 360, in accordance with an embodiment. The image sensor of a light field camera is formed using an array of macropixels 360. Each macropixel 360 includes a plurality of pixels of the sensor and a single corresponding microlens 330. Accordingly, an image sensor that is an n×N array of macropixels includes an array of pixels that are each covered by a corresponding microlens 330. The top view 300 includes a pixel 310, a pixel 315, and a microlens 330. The pixel 310 is an embodiment of the pixel 220 of FIG. 2A. The pixel 320 is another embodiment of the pixel 220 of FIG. 2A.

The microlens 330 is functionally and structurally similar to the microlens 230 of FIG. 2A except for a modified structure covering a plurality of pixels. The top view 300 shows the microlens 330 covering the pixel 310 and the pixel 320. In some embodiments, the microlens 330 has a diameter ranging from 6 microns to 30 microns and a height ranging from 1 micron to 10 microns. In the embodiment of FIG. 3A, the microlens 330 covers four pixels of the image sensor. In alternate embodiments, the microlens 330 covers two or more pixels of the image sensor. The microlens 330 is an optical lens that has a surface profile including, but not restricted to, spherical (e.g., hemisphere), cylindrical, freeform, concave, convex, aspherical, Fresnel, or some combination thereof.

Figure 3B:
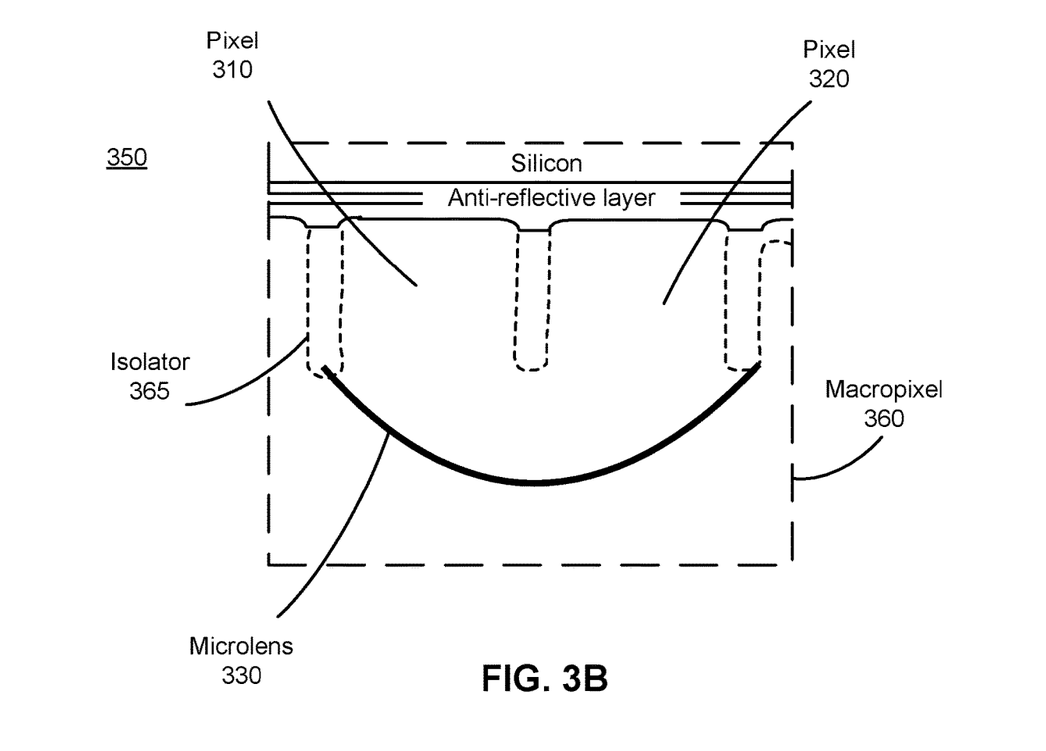
FIG. 3B is a cross section of a portion of an image sensor for a light field camera, in accordance with an embodiment.

FIG. 3B is a cross section 350 of a portion of an image sensor for a light field camera, in accordance with an embodiment. The cross section 350 includes the pixel 310, the pixel 320, the microlens 330, the macropixel 360, and an isolator 365. The isolator 365 is an embodiment of the isolator 265 of FIG. 2B. In some embodiments, the macropixel 360 includes the pixel 310, the pixel 320, the associated microlens 330, a plurality of isolators 365 and a plurality of anti-reflective (AR) layers. Each of the plurality of AR layers suppresses the reflection of the light field received by at least one of the pixel 310 and the pixel 320.

Figure 3C:
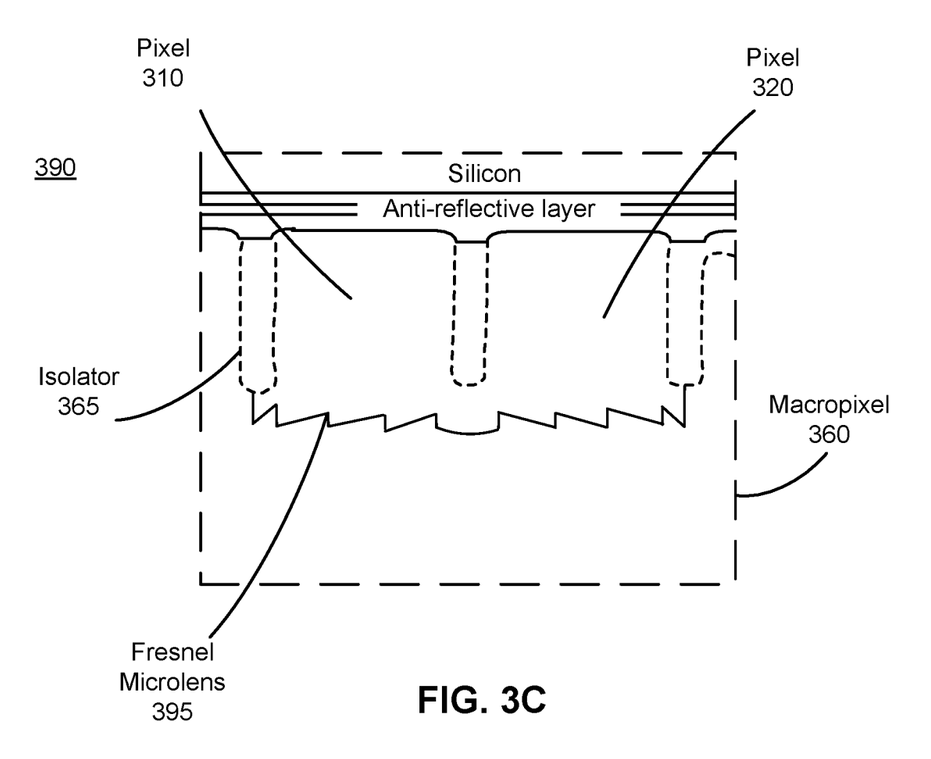
FIG. 3C is a cross section of a portion of an image sensor for a light field camera with a Fresnel microlens, in accordance with an embodiment.

FIG. 3C is a cross section 390 of a portion of an image sensor for a light field camera with a Fresnel microlens 395, in accordance with an embodiment. The Fresnel microlens 395 is an embodiment of the microlens 330.

As noted above, one advantage of a Fresnel lens is it is has a relatively flat lens structure (e.g., compared to a traditional convex lens structure). Accordingly, thickness and weight of the Fresnel microlens 395 can be significantly reduced. The reduction in thickness is especially important as the Fresnel microlens 395 spans multiple pixels 310. The Fresnel microlens 395 may be fabricated using the same techniques described above with reference to FIG. 2C.

Figure 4:
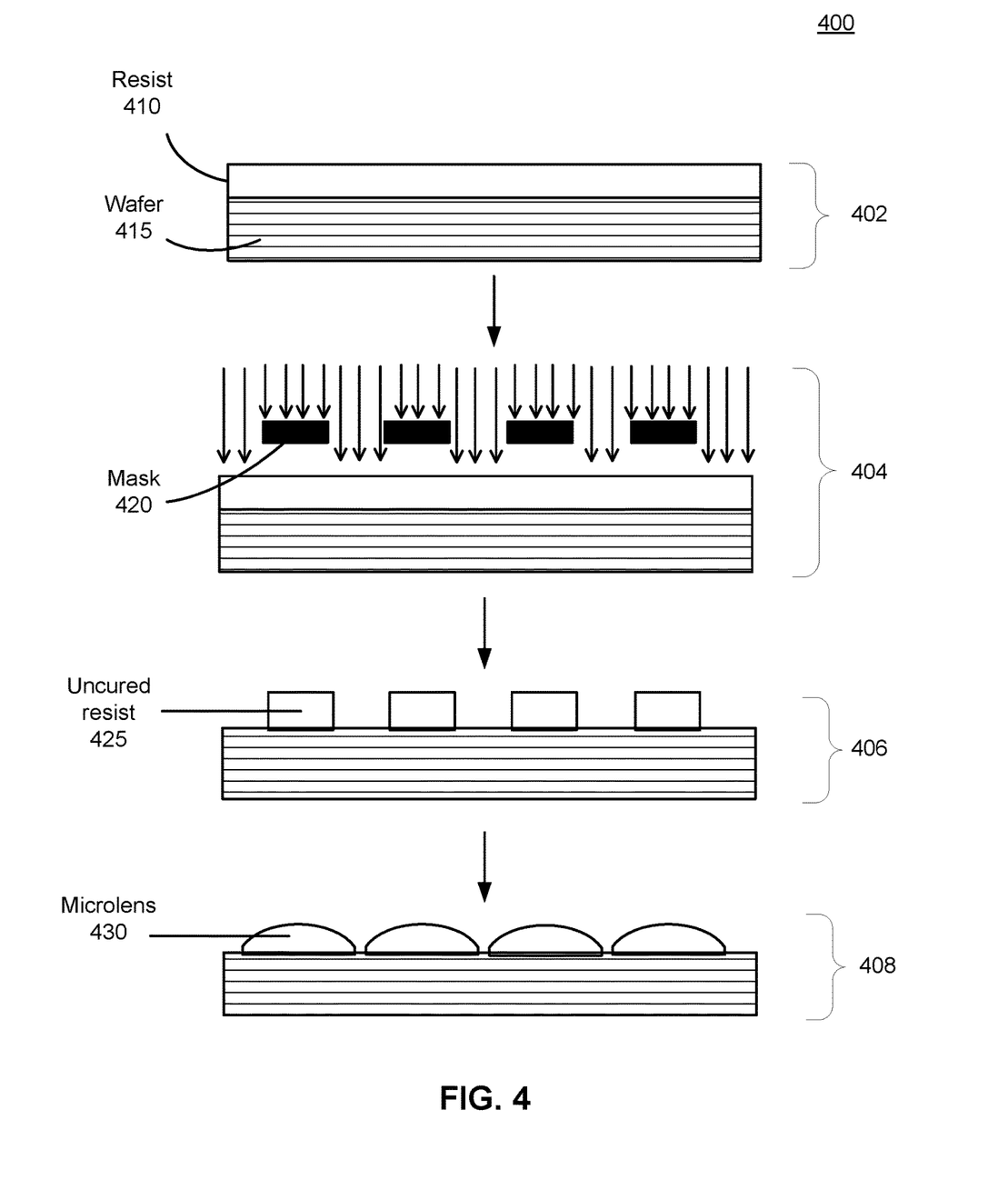
FIG. 4 illustrates an example of a fabrication of an array of microlenses by a manufacturing system, in accordance with an embodiment.

FIG. 4 illustrates an example 400 of a fabrication of an array of microlenses by a manufacturing system, in accordance with an embodiment. The manufacturing system is a set of sub-systems that perform the fabrication of the array of microlenses in the image sensor of the light field camera. In some embodiments, the manufacturing system includes at least one of a cleaning system, a spinning system, a patterning system, a curing system, or some combination thereof. The cleaning system includes one or more process equipment used for wafer cleaning. The spinning system includes one or more process equipment used for spinning a material on a substrate. The patterning system includes one or more process equipment used for lithographic patterning of the substrate. The curing system includes one or more process equipment used for thermal curing of the patterned substrate.

The example 400 involves spinning 402 a resist 410 on a wafer 415 by the spinning system. For example, the resist 410 can be a photoresist (e.g. PMMA) and the wafer 415 can be a substrate wafer (e.g. silicon, glass). The resist 410 has a thickness of few microns which is determined by the design of an optical system and the characteristics of the microlens 230, such as the numerical aperture, focal distance, etc. The wafer 415 undergoes a surface preparation by the cleaning system as described below in conjunction with FIG. 5. In some embodiments, the wafer 415 includes one or more additional layers (e.g. silicon dioxide) of thickness in few tens of microns on top of the substrate wafer. The thickness of each of the additional layers affects a focal length of the array of microlens. For example, the focal length is typically the sum of the thickness of the one or more additional layers and a few hundreds of nanometers. After spinning 402 of the resist 410, the resist 410 undergoes a patterning 404 using a mask 420 which is an element of the manufacturing system in order to align some portions of the resist 410 with one or more pixels of the image sensor in the wafer 415. In some embodiments, the mask 420 may be based on aligning the wafer 415 to a specific pattern that is transferred from the mask 420 on to the resist 410. For example, the mask 420 is made of a photosensitive material that can selectively transmit an image light from an optical source. The resist 410 structural changes 406 after patterning 404 with the mask 420 to form an uncured resist 425. In some embodiments, the structural change 406 is obtained by stripping some portions of the resist 410 after patterning 404 with the mask 420. The curing system cures 408 the uncured resist 425 into an array of microlens 430 by a thermal reflow process. The thermal reflow process may involve curing 408 the uncured resist 425 into an intermediate shape (e.g. a cylindrical block) which further undergoes a spreading to form a final shape of the array of microlens 430. The spreading is a process that changes an intermediate shape of the uncured resist 425 into a final shape of the array of microlens 430 based on a combination of physical and chemical processes that happen on a surface of the wafer 415. In one example, the spreading is driven by heating the wafer 415 to a target temperature in vacuum. In alternate example, the spreading is driven by applying a pressure on the uncured resist 425 to form the final shape of the array of microlens 430. The thermal reflow process is precisely controlled (e.g., no large gaps between neighbor pixels and adjacent microlenses should not touch each other).

Figure 5:
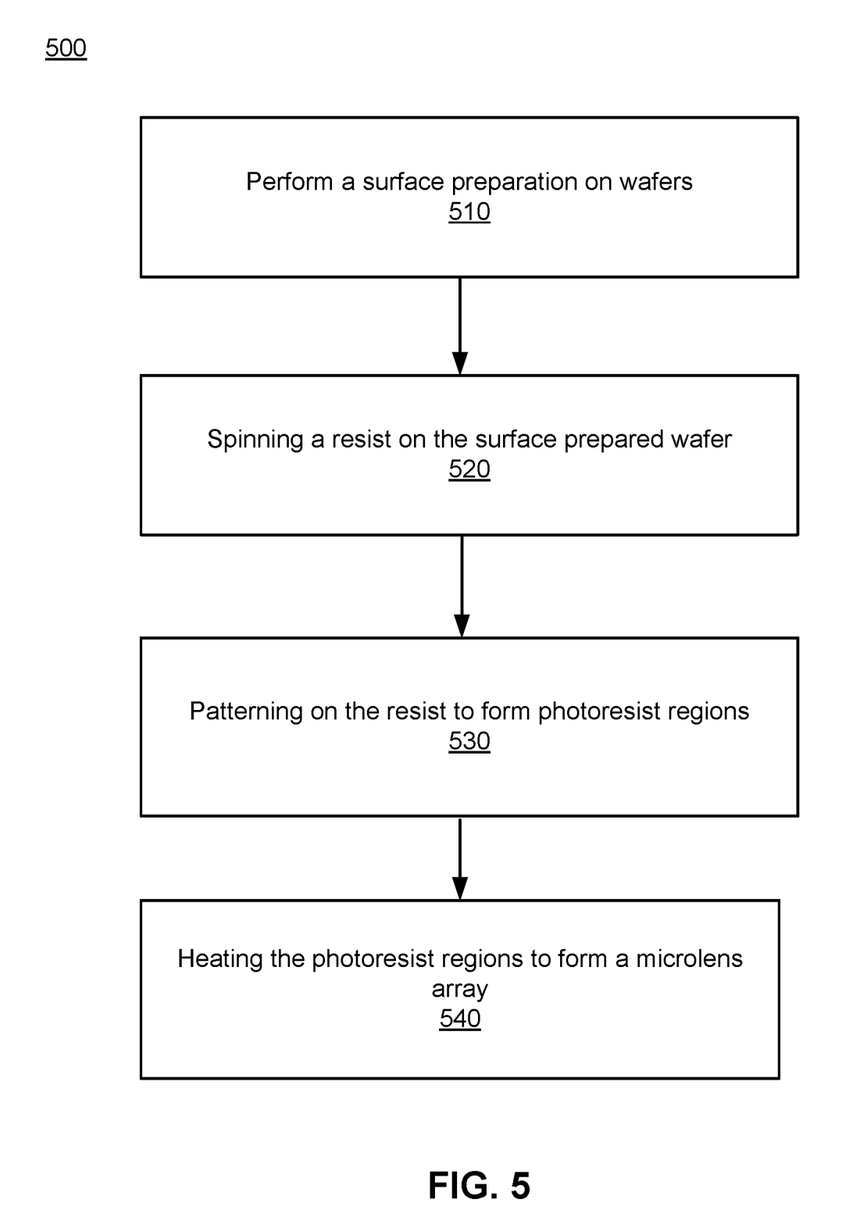
FIG. 5 is a process for the fabrication of the array of microlenses of FIG. 4, in accordance with an embodiment.

FIG. 5 is a process 500 for the fabrication of the array of microlens of FIG. 4, in accordance with an embodiment. The process 500 of FIG. 5 may be performed by the manufacturing system of FIG. 4. Other entities may perform some or all of the steps of the process in other embodiments. Likewise, embodiments may include different and/or additional steps, or perform the steps in different orders.

The manufacturing system performs 510 a surface preparation on the wafer 415 of FIG. 4. In some embodiments, the surface preparation includes a cleaning step and a dehydration step. For example, the wafers are cleaned followed by baking to dehydrate the wafer surface.

The manufacturing system spins 520 the resist 410 on the surface prepared wafer 415 on the resist 410 to form photoresist regions as described above in conjunction with FIG. 4. In some embodiments, the manufacturing system spins 520 an additional layer prior to spinning the resist 410 in order to increase the adhesion of the resist 410 on the wafer 415.

The manufacturing system patterns 530 the resist 410 to form photoresist regions. In some embodiments, the manufacturing system performs a lithographic patterning of the resist 410 to form one or more photoresist regions.

The manufacturing system heats 540 the photoresist regions using the thermal reflow process described above in conjunction with FIG. 4 to form the array of microlens 430. In one example, the manufacturing system performs a thermal curing of blocks of uncured photoresists to form the array of microlens 430 of an image sensor. Each microlens in the array of microlens 430 covers at least one of the pixels of the image sensor formed on the wafer.

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An image sensor manufactured by performing the steps of:
    performing a preparation of a surface of a wafer comprising a plurality of pixels of an image sensor formed on the wafer by cleaning the surface of the wafer and dehydrating the cleaned surface, each pixel comprising a plurality of anti-reflective layers made of silicon nitride;
    depositing a layer of photoresist on the surface of the wafer;
    performing a patterning on the deposited layer, the patterning forming one or more blocks of uncured photoresists; and
    performing a thermal curing of the one or more blocks of uncured photoresists, the thermal curing forming an array of microlenses of the image sensor from the one or more blocks of uncured photoresists, each microlens covering at least two of the plurality of pixels formed on the wafer, each microlens forming a portion of the image sensor.

2. The image sensor of claim 1, wherein the image sensor comprises an array of macropixels, each macropixel including at least two of the plurality of pixels, and the at least two pixels are covered by a single microlens of the array of microlenses.

3. The image sensor of claim 1, wherein the image sensor is configured to sense a light field focused by the array of microlenses, the light field comprising information about intensity and angle information for one or more objects in a field of view of a light field camera.

4. The image sensor of claim 1, wherein the microlens is composed of materials selected from a group consisting of: plastics, glass, polyimides, polyimides nanocomposite, titania nanocomposite, polyphenylquinoxalines, organometallic polymers, or some combination thereof.

5. The image sensor of claim 1, wherein the microlens is an optical lens with a surface profile selected from a group consisting of: spherical, cylindrical, freeform, concave, convex, aspherical, Fresnel, or some combination thereof.

6. The image sensor of claim 1, wherein the microlens covers one or more isolators located in between the plurality of pixels, each isolator configured to suppress cross talk between adjacent pixels.

7. The image sensor of claim 1, wherein each anti-reflective layer is configured to suppress reflection of light field received by at least one of the plurality of pixels.

8. The image sensor of claim 1, wherein performing the thermal curing of the one or more blocks of uncured photoresists further comprises:
    performing a curing of the one or more blocks of uncured photoresists into an intermediate shape of the array of microlenses; and
    performing a spreading of the cured blocks, the spreading changing the intermediate shape into a final shape different from the intermediate shape.

9. The image sensor of claim 1, wherein each microlens has a diameter in a range of 6 microns to 30 microns.

10. The image sensor of claim 1, wherein each microlens has a height in a range of 1 micron to 10 microns.

11. A method comprising:
    performing a preparation of a surface of a wafer comprising a plurality of pixels of an image sensor formed on the wafer by cleaning the surface of the wafer and dehydrating the cleaned surface, each pixel comprising a plurality of anti-reflective layers made of silicon nitride;
    depositing a layer of photoresist on the surface of the wafer;
    performing a patterning on the deposited layer, the patterning forming one or more blocks of uncured photoresists; and
    performing a thermal curing of the one or more blocks of uncured photoresists, the thermal curing forming an array of microlenses of the image sensor from the one or more blocks of uncured photoresists, each microlens covering at least two of the plurality of pixels formed on the wafer, each microlens forming a portion of the image sensor.

12. The method of claim 11, wherein the image sensor comprises an array of macropixels, each macropixel including at least two of the plurality of pixels, and the at least two pixels are covered by a single microlens of the array of microlenses.

13. The method of claim 11, wherein the image sensor is configured to sense a light field focused by the array of microlenses, the light field comprising information about intensity and angle information for one or more objects in a field of view of a light field camera.

14. The method of claim 11, wherein the microlens is composed of materials selected from a group consisting of: plastics, glass, polyimides, polyimides nanocomposite, titania nanocomposite, polyphenylquinoxalines, organometallic polymers, or some combination thereof.

15. The method of claim 11, wherein the microlens is an optical lens with a surface profile selected from a group consisting of: spherical, cylindrical, freeform, concave, convex, aspherical, Fresnel, or some combination thereof.

16. The method of claim 11, wherein the microlens covers one or more isolators located in between the plurality of pixels, each isolator configured to suppress cross talk between adjacent pixels.

17. The method of claim 11, wherein performing the thermal curing of the one or more blocks of uncured photoresists further comprises:
    performing a curing of the one or more blocks of uncured photoresists into an intermediate shape of the array of microlenses; and
    performing a spreading of the cured blocks, the spreading changing the intermediate shape into a final shape different from the intermediate shape.

18. The method of claim 11, wherein each microlens has a diameter in a range of 6 microns to 30 microns.

19. The method of claim 11, wherein each microlens has a height in a range of 1 micron to 10 microns.

20. The method of claim 11, wherein each anti-reflective layer is configured to suppress reflection of light field received by at least one of the plurality of pixels.

* * * * *

UNITED STATES PATENT AND TRADEMARK OFFICE
CERTIFICATE OF CORRECTION

PATENT NO. : 10,714,520 B1  
APPLICATION NO. : 16/030206  
DATED : July 14, 2020  
INVENTOR(S) : Xinqiao Liu et al.

Page 1 of 1

It is certified that error appears in the above-identified patent and that said Letters Patent is hereby corrected as shown below:

In the Claims

Column 9, Line 16, Claim 1, after "performing" delete "the".

Signed and Sealed this  
Twenty-second Day of December, 2020

Andrei Iancu  
*Director of the United States Patent and Trademark Office*